(12) United States Patent
Gruber et al.

(10) Patent No.: US 8,987,132 B2
(45) Date of Patent: Mar. 24, 2015

(54) DOUBLE SOLDER BUMPS ON SUBSTRATES FOR LOW TEMPERATURE FLIP CHIP BONDING

(71) Applicant: International Business Machines Corporation, Armonk, NY (US)

(72) Inventors: Peter A. Gruber, Mohegan Lake, NY (US); Paul A. Lauro, Brewster, NY (US); Jae-Woong Nah, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/467,564

(22) Filed: Aug. 25, 2014

(65) Prior Publication Data

US 2014/0363965 A1 Dec. 11, 2014

Related U.S. Application Data

(62) Division of application No. 13/600,204, filed on Aug. 30, 2012, now Pat. No. 8,828,860.

(51) Int. Cl.
*H01L 21/00* (2006.01)
*H01L 23/00* (2006.01)

(52) U.S. Cl.
CPC ....... *H01L 24/11* (2013.01); *H01L 2224/11011* (2013.01); *H01L 2924/35* (2013.01); *H01L 2924/20104* (2013.01); *H01L 2924/01047* (2013.01); *H01L 2924/01049* (2013.01); *H01L 2924/0105* (2013.01); *H01L 2924/01083* (2013.01); *H01L 2924/20106* (2013.01); *H01L 2924/20107* (2013.01); *H01L 2924/01079* (2013.01)

USPC ............................................. 438/614; 438/615

(58) Field of Classification Search
USPC ................................................. 438/612–617
See application file for complete search history.

(56) References Cited

U.S. PATENT DOCUMENTS

| | | |
|---|---|---|
| 5,268,072 A | 12/1993 | Agarwala et al. |
| 5,376,584 A | 12/1994 | Agarwala |
| 5,872,400 A | 2/1999 | Chapman |
| 6,344,234 B1 | 2/2002 | Dalal |
| 7,838,954 B2 | 11/2010 | Buchwalter |
| 7,846,829 B2 | 12/2010 | Tanaka |
| 7,931,187 B2 | 4/2011 | Gruber |
| 8,828,860 B2 * | 9/2014 | Gruber et al. ................ 438/614 |
| 2005/0200013 A1 | 9/2005 | Ho |
| 2011/0201194 A1 | 8/2011 | Gruber |
| 2011/0233762 A1 | 9/2011 | Gruber |
| 2011/0285011 A1 | 11/2011 | Hwang et al. |
| 2014/0065771 A1 | 3/2014 | Gruber et al. |

FOREIGN PATENT DOCUMENTS

JP 62117346 5/1987

* cited by examiner

*Primary Examiner* — Richard Booth
(74) *Attorney, Agent, or Firm* — Daniel P. Morris; Otterstedt, Ellenbogen & Kammer, LLP

(57) ABSTRACT

Multiple injections of molten solder are employed to form double solder bumps having outer layers that melt at lower temperatures than the inner portions thereof. During a flip chip assembly process, the reflow temperature is above the melting temperature of the outer layers and below the melting temperature of the inner portions of the solder bumps. As the inner portions of the solder bumps do not collapse during reflow, a flip chip assembly can be made at relatively low temperatures and have a high stand-off height. A structure having double solder bumps facilitates flip chip assembly.

2 Claims, 8 Drawing Sheets

DOUBLE SOLDER BUMPS ON SUBSTRATES FOR LOW TEMPERATURE FLIP CHIP BONDING

CROSS-REFERENCE TO RELATED APPLICATIONS

This patent application is a divisional of U.S. patent application Ser. No. 13/600,204 filed Aug. 30, 2012, entitled "DOUBLE SOLDER BUMPS ON SUBSTRATES FOR LOW TEMPERATURE FLIP CHIP BONDING." The complete disclosure of the aforementioned U.S. patent application Ser. No. 13/600,204 is expressly incorporated herein by reference in its entirety for all purposes.

FIELD

The present disclosure generally relates to the electrical and electronic arts and, more particularly, to solder deposition on substrates.

BACKGROUND

Flip chip technology has been widely used as it allows a high I/O count, high density interconnection scheme with proven performance and reliability. Solder bumps are deposited on contact pads on both chip surfaces and substrate surfaces, and then the chips are flipped and positioned such that the solder bumps are aligned with matching pads of an external circuit. Solder reflow completes the interconnection process, after which underfill material is introduced to fill the spaces about the interconnections.

Solder flip chip assembly can be performed by a solder reflow process. The chip and the substrate should experience the temperature above the melting point of the solder bumps to provide an interconnection between the chip and the substrate. During the reflow process, the coefficient of thermal expansion (CTE) mismatch between, for example, a silicon-based chip and an organic substrate builds thermally induced stress in the flip chip structure. Therefore, when the lower melting temperature solders are used for forming interconnection, the thermally induced stress is decreased. However, while the use of solder having a relatively low melting point can reduce thermally induced stress, it may be subject to failure under high current stress and high temperature storage conditions as it forms intermetallic compounds with under bump metallurgy (UBM) and substrate pad metals at lower temperatures than relatively high melting point solders.

SUMMARY

Principles of the present disclosure provide techniques for direct IMS (injection molded solder) for forming solder bumps on substrates. In one aspect, an exemplary method includes providing a substrate having a plurality of contact pads, positioning a first flexible mask on the substrate, the first flexible mask including a plurality of first holes, the first mask being positioned such that the plurality of first holes are aligned with the plurality of contact pads, injecting a molten first solder having a first melting point into the first holes, and allowing the first solder to solidify, whereby the first solder adheres to the contact pads and forms a plurality of first solder bumps. The first mask is removed from the substrate and a second mask is positioned on the substrate, the second mask including a plurality of second holes. The second mask is positioned such that the second holes are aligned with the plurality of first solder bumps. A molten second solder having a second melting point lower than the first melting point is injected into the second holes and covers the first solder bumps, the first solder bumps remaining solid during the injection of the molten second solder. The second solder solidifies to form second solder bumps comprising the first and second solders, the second solder adhering to and forming layers respectively covering each of the first solder bumps.

A further method includes obtaining a structure comprising a substrate having a plurality of recesses, a plurality of electrically conductive contact pads within the recesses, and a plurality of first solder bumps comprised of a first solder adjoining the contact pads and having projecting portions extending above a top surface of the substrate. A flexible mask is positioned on the substrate, the mask including a plurality of holes. The mask is positioned such that the holes are aligned with the plurality of first solder bumps. The method further includes injecting a molten second solder having a melting point lower than the melting point of the first solder into the holes and covering the first solder bumps, the first solder bumps remaining solid during the injection of the molten second solder, allowing the second solder to solidify to form second solder bumps comprising the first and second solders, the second solder adhering to and forming layers respectively covering each of the first solder bumps, and removing the flexible mask from the substrate.

A third method includes providing a substrate having a plurality of recesses and a plurality of electrically conductive contact pads within the recesses, injecting a molten first solder having a first melting point into the recesses, allowing the first solder to solidify, whereby the first solder adheres to the contact pads and forms a plurality of solder elements, and positioning a flexible mask on the substrate. The flexible mask includes a plurality of holes, the mask being positioned such that the plurality of holes are aligned with the plurality of recesses in the substrate. The method further includes injecting a molten second solder having a second melting point lower than the first melting point into the holes, covering the solder elements formed from the first solder while the solder elements remain in solid form, and allowing the second solder to solidify, whereby the first solder adheres to the contact pads and forms a plurality of solder bumps.

A fourth method provided in accordance with the principles expressed herein includes obtaining a structure comprising: 1) a substrate including a plurality of recesses, 2) a plurality of electrically conductive contact pads within the recesses, and 3) a plurality of solder bumps, each solder bump including a first solder bump structure comprised of a first solder having a first melting point, the first solder bump structure adjoining one of the contact pads and extending above a top surface of the substrate, and a layer of second solder completely covering the first solder bump structure, the second solder having a lower melting point than the first solder. Electrically conductive elements of an integrated circuit chip are contacted with the solder bumps. The method further includes causing reflow of the layers of second solder, the first solder bump structures remaining solid during reflow of the layers of second solder, and causing the second solder to solidify such that the structure is attached to the integrated circuit chip.

A structure in accordance with the present disclosure includes a substrate including a plurality of recesses, a plurality of electrically conductive contact pads, each contact pad being positioned in one of the plurality of recesses in the substrate, and a plurality of first solder bumps comprised of a first solder having a first melting point, each first solder bump extending into one of the plurality of recesses, contacting one of the plurality of contact pads and extending above a top surface of the substrate. Each of the plurality of first solder bumps is completely covered above the substrate by a layer comprising a second solder, the second solder having a second melting point, the second melting point being below the first melting point.

A second structure in accordance with the disclosure includes a substrate including a plurality of recesses, a plurality of electrically conductive contact pads, each contact pad being positioned in one of the plurality of recesses in the substrate, and a plurality of solder bumps. Each solder bump includes a solder element comprised of a first solder having a first melting point. Each solder element is positioned within one of the plurality of recesses, contacts one of the plurality of contact pads and has a top surface coplanar with a top surface of the substrate. Each solder bump further comprises a covering layer comprised of a second solder having a second melting point lower than the first melting point, each covering layer contacting one of the solder elements and extending above the top surface of the substrate.

A third exemplary structure comprises a substrate having a top surface and a plurality of electrically conductive contact pads, a plurality of solder bumps, each of the solder bumps including a frustoconical element contacting one of the contact pads, the frustoconical element being comprised of a first solder material, and solder layers completely covering each of the frustoconical elements, each solder layer being comprised of a second solder material having a melting point lower than the melting point of the first solder material.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a tangible computer readable recordable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a tangible computer-readable recordable storage medium (or multiple such media).

DETAILED DESCRIPTION

Initially, the complete disclosure of commonly assigned U.S. Pub. No. 2011/0201194 and U.S. Pat. No. 7,931,187 are expressly incorporated herein by reference in their entireties for all purposes.

Multiple injections of molten solder are employed in accordance with one or more exemplary embodiments to form double solder bumps having outer layers that melt at lower temperatures than the inner portions thereof. During a flip chip assembly process, the reflow temperature is above the melting temperature of the outer layers and below the melting temperature of the inner portions of the solder bumps. As the inner portions of the solder bumps do not collapse during reflow, a flip chip assembly can be made at relatively low temperatures and have a high stand-off height. A structure having double solder bumps facilitates flip chip assembly. When solder bumps are collapsed during reflow for flip chip assembly, a low stand-off height is undesirable in terms of stress of the flip chip structure. Also, the collapse of solder bumps during reflow is related to solder bridging, which may result in an electrical short. If solder bumps do not need to fully melt during the flip chip assembly process, as when stand-off heights are relatively high, only the surfaces of the bumps are melted and used for making the joints between the chip and the substrate, resulting in lower stress. A method for making flip chip interconnections at relatively low temperature using solders that have relatively low melting points, but forming intermetallic compounds with solders having relatively high melting points, is provided in accordance with the present disclosure.

Figure 1A:
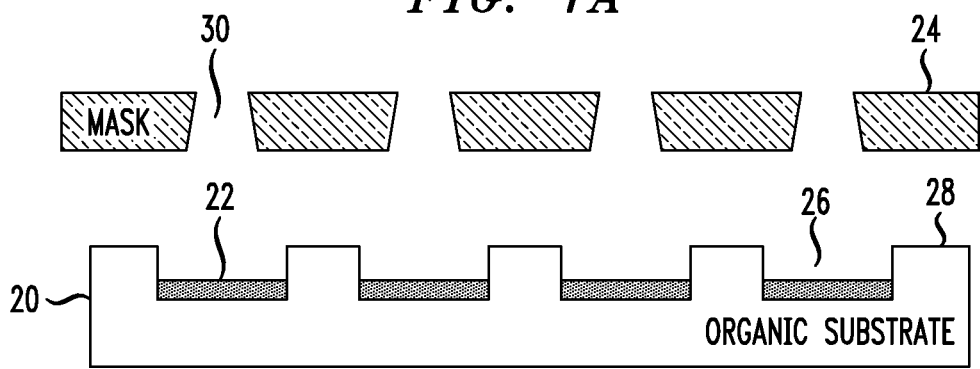
FIGS. 1A-J schematically illustrate an IMS procedure for depositing two solders on a substrate by using two masks, the bottom solder having a relatively low melting point and the top solder having a relatively high melting point.

Referring to FIGS. 1A-E, steps in performing a method in accordance with one aspect of the disclosure are shown. As shown in FIG. 1A, an organic substrate 20 including rows of wet-able contact pads 22 and a flexible mask 24 are provided. Non-limiting examples of organic substrates include laminate materials made of glass fibers in an epoxy and bismaleimide triazine (BT) resin. Ceramic substrates can be used in other exemplary embodiments. Wafer-size substrates, round or otherwise, may be employed. The substrate may be formed from a base substrate with a solder resist (SR) surface. The mask may be, for example, a polyimide film, a non-wetting metal such as molybdenum, stainless steel or aluminum, or other material that does not react with the solder to be employed in the method. A dry film mask or a rigid mask may alternatively be employed, particularly where wafer substrates are utilized. The mask employed should preferably have sufficient flexibility to overcome possible topography and warpage issues that may occur when employing organic substrates. The wet-able pads may be copper, gold or nickel in some embodiments of the method. The recesses 26 in the substrate 20 of one or more embodiments of the method are such that the top surfaces of the contact pads 22 are recessed below the top surface 28 of the substrate by about 5-15 microns. In some embodiments where two masks are employed to deposit solders having different melting points, as discussed further below, the contact pads 22 do not need to be within recesses. It will be appreciated that the contact pads 22 may or may not be of uniform height. The mask 24 includes frustoconical holes 30. The relatively wide openings of the holes face the organic substrate to facilitate separation after solder injection as described below.

Figure 1B:
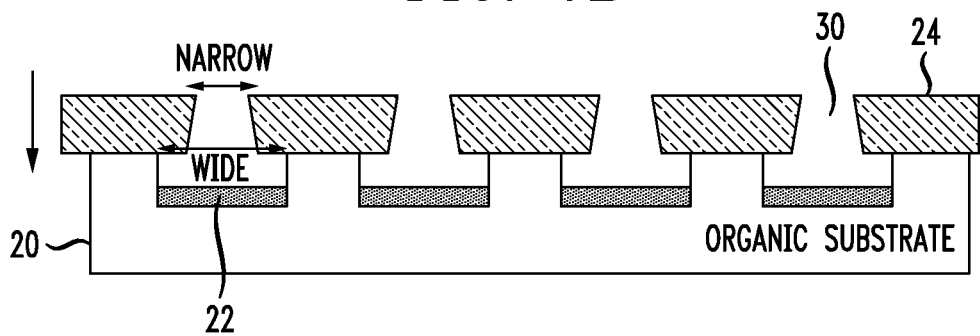

Referring to FIG. 1B, the mask 24 is positioned on the substrate such that the holes 30 in the mask are aligned with the recesses 26 and contact pads 24. If a dry film mask is employed, the mask is weakly adhered to the top surface 28 of the substrate and the dry film mask is stripped by solvent after IMS. If, for example, a reusable polyimide mask is employed, the mask simply overlies and contacts the substrate surface. The diameter of the relatively wide opening of each hole 30 in the mask 24 is smaller than the diameter of each corresponding recess 26 in this exemplary embodiment.

Figure 1C:
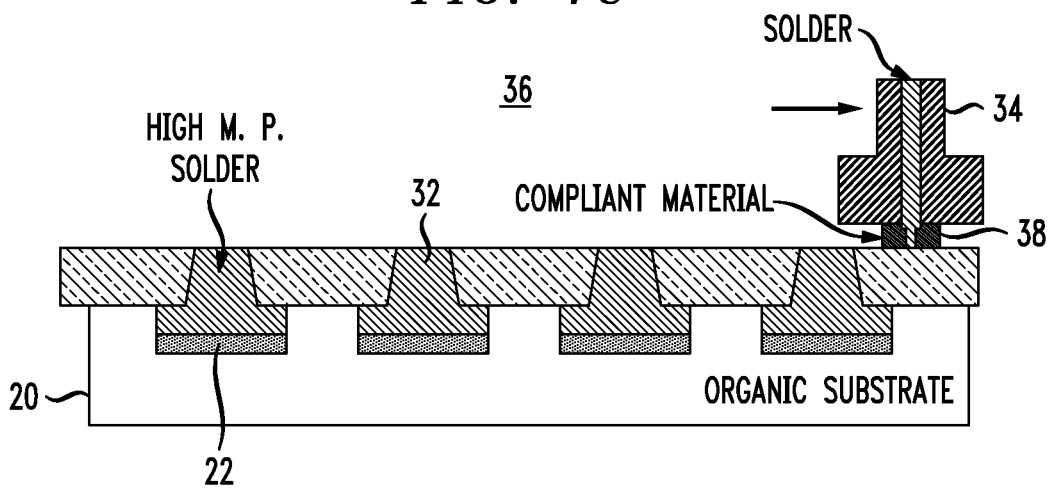

The substrate recesses 26 and adjoining mask holes 30 are each injected with molten solder 32 by a fill head 34 that traverses the substrate, as shown in FIG. 1C. The holes are filled completely to the tops, thereby ensuring uniformity of height of the resulting solder bumps without leaving a solder residue on the mask. No solder flux is required nor is any employed in one or more exemplary embodiment of the method. The absence of flux prevents volume shrinkage. The molten solder is directly injected into the recesses 26 and holes 30 in a low oxygen environment 36, preferably less than 10,000 ppm in a nitrogen environment. Alternatively, a forming gas environment including nitrogen and hydrogen may be employed (e.g. 90% $N_2$, 10% $H_2$). The mask is sufficiently flexible to track the topography of the substrate under the influence of a compressive force distributed by compliant material 38 attached to the fill head 34. The compliant material may include, for example, a bulk compressible layer with a thin, low-friction layer adjacent the mask 24. Non-limiting examples of the compliant material include silicone rubber and silicone closed cell sponge. Non-limiting examples of the low friction layer include fluoropolymers such as TEFLON® and RULON®. The total thickness of the low friction layer and bulk compressible layer may be, for example, from about 0.79-6.35 mm, preferably about 1.59 mm. The contact pressure exerted on the substrate by the fill head may be about ten to sixty pounds per square inch, preferably about fifteen PSI. The compliant material 38 allows good contact and helps avoid solder leakage between the mask and the organic substrate 20 in cases where a reusable polyimide mask is employed. The solder injected during the step illustrated in FIG. 1C has a relatively high melting point, though preferably below 285° C. where an organic substrate as discussed above is employed. Exemplary solders having relatively high melting points, indicated in parentheses, include Sn-20Au (280° C.), Sn-5Sb (243° C.), pure Sn (232° C.), Sn-0.7Cu (227° C.), Sn-3.5Ag (221° C.) and Sn-3.8AG-1.0Cu (217° C.). The specified solders are considered exemplary and non-limiting.

Figure 1D:
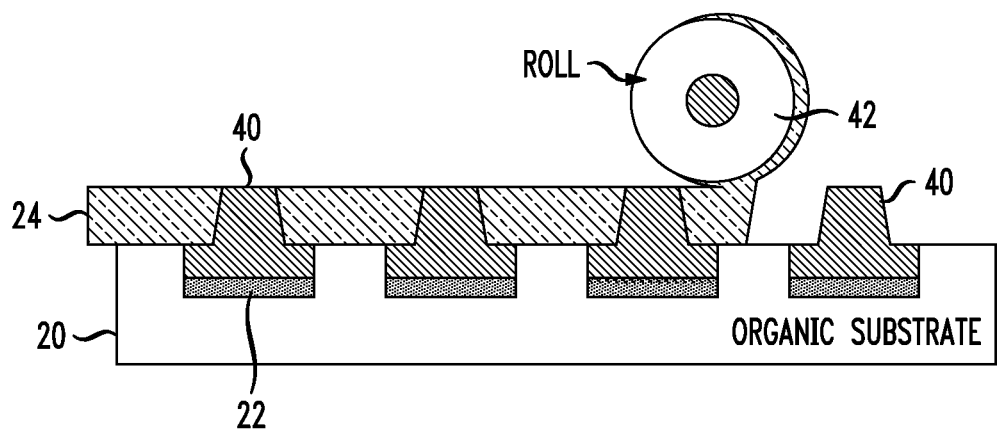
Figure 1E:
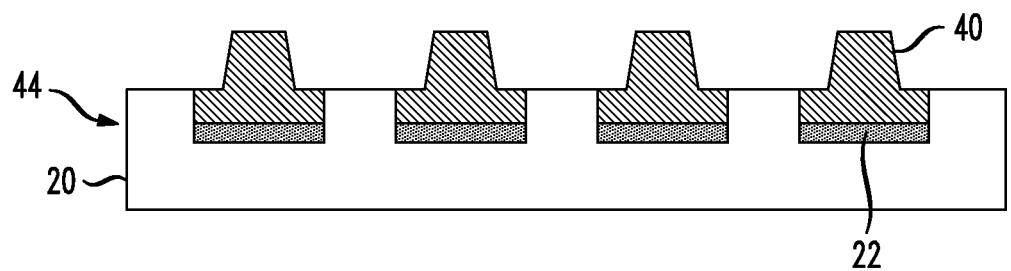

The injected solder solidifies as shown in FIG. 1D, also in a low oxygen environment, forming the bumps 40 conforming to the configurations of the mask openings and substrate recesses. The solidified solder in the recesses forms base portions of the bumps while the solder that solidifies in the mask openings forms projecting portions that extend above the top surface of the substrate 20. The base portions of the bumps are larger in diameter than the maximum diameter of the projecting portions thereof, and accordingly have top surfaces that are coplanar with the top surface of the substrate. The top surfaces of the projecting portions of the bumps 40 produced in this manner are sufficiently flat as to not require coining. The heights of the bumps 40 depend on the diameters of the pads 22. In this exemplary embodiment, if a pad diameter is "d", the bump height is between about 0.2-1.0d. Following solidification of the solder, the mask 24 is removed. In the case of a polyimide mask that is not attached to the substrate, a roll 42 can be employed to take up the mask. As there is no solder residue on the mask, it can be re-used without requiring cleaning. The resulting assembly 44 is shown in FIG. 1E.

Figure 1F:
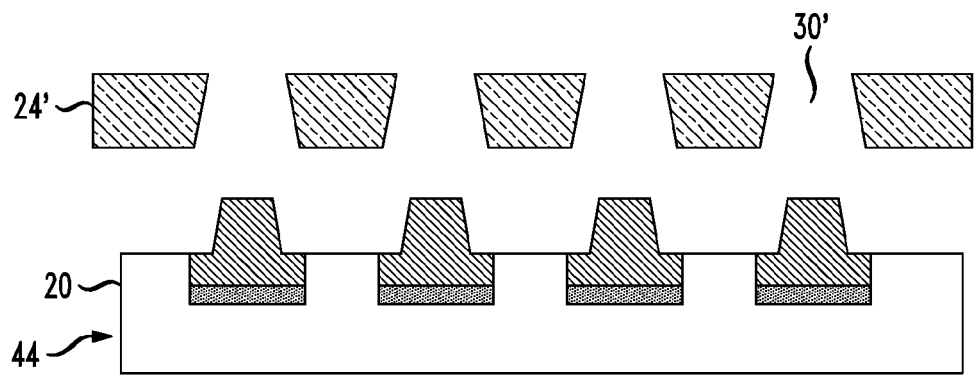
Figure 1G:
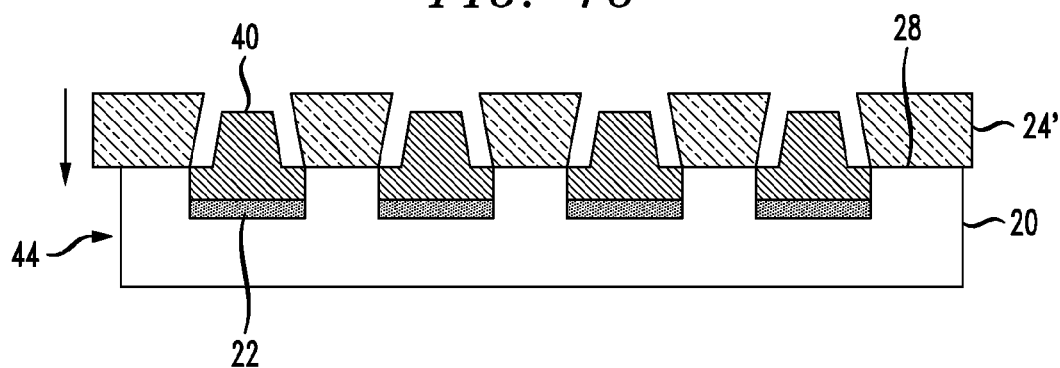
Figure 1H:
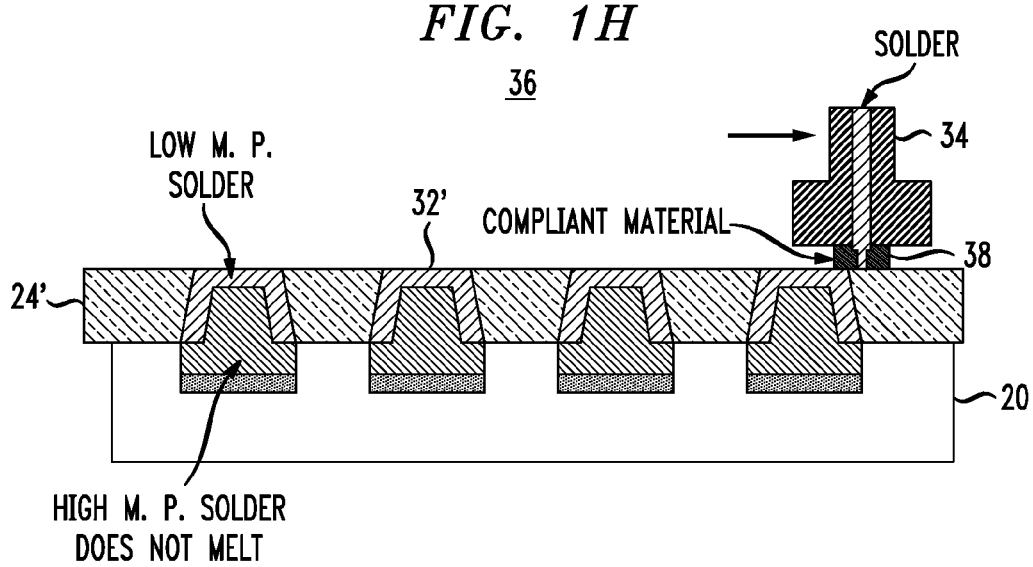

FIGS. 1F-H illustrate a second IMS procedure that follows the first IMS procedure discussed with respect to FIGS. 1A-E. Once the structure 44 has been obtained, a second flexible mask 24' is provided. This mask can be of similar composition as the mask 24 discussed with respect to FIGS. 1A-D. The second mask 24' has frustoconical holes 30' similar in configuration though having larger dimensions, preferably both in diameter and length, than those of the first mask 24. The diameter of the relatively wide opening portion of each hole 30' in the mask 24' is the same as the diameter of each corresponding recess 26 in this exemplary embodiment. Referring to FIG. 1G, the second mask 24' is positioned on the structure 44, contacting the upper surface 28 of the substrate 20. The holes 30' in the second mask 24' are aligned with the solder bumps 40 formed from the solder 32 having the relatively high melting point. Referring to FIG. 1H, the compliant material 38 incorporated with the solder fill head 34 engages the second mask 24' while molten solder 32' is injected within the holes 30'. The solder 32' has a melting point that is lower than the melting point of the solder 32 used to form the solder bumps 40 in the structure 44. Non-limiting examples of relatively low melting point solders and their melting points include Sn-52In (118° C.), Sn-57Bi (139° C.) and 97In-3Ag (143° C.). The step shown in FIG. 1H is conducted in a low oxygen environment 36. The solder bumps 40 formed from the solder 32 having a relatively high melting point do not melt during the injection of the molten solder 32' having the relatively low melting point. Solder residue should not remain on the mask 24' following the procedure as described above. The molten solder 32' contacts all exposed surfaces of the solder bumps 40, covering the top surfaces of the base portion as well as the entireties of the projecting portions of the bumps 40.

Figure 1I:
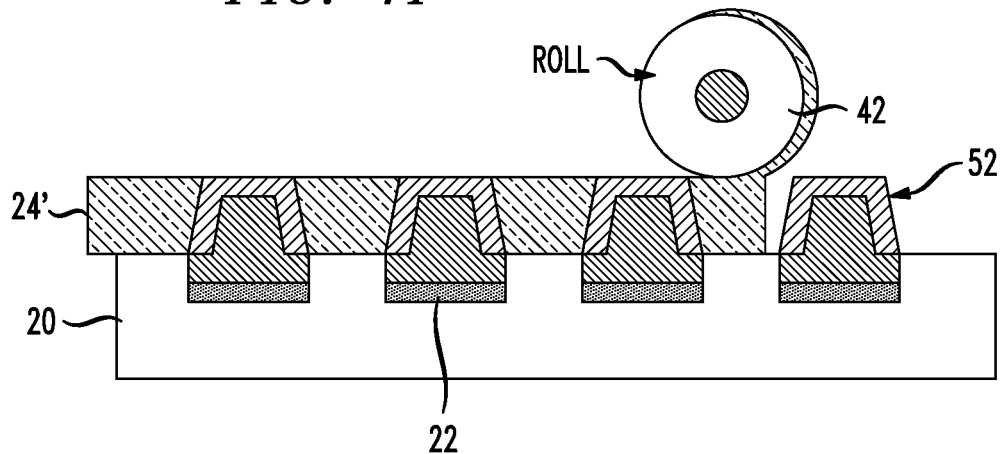
Figure 1J:
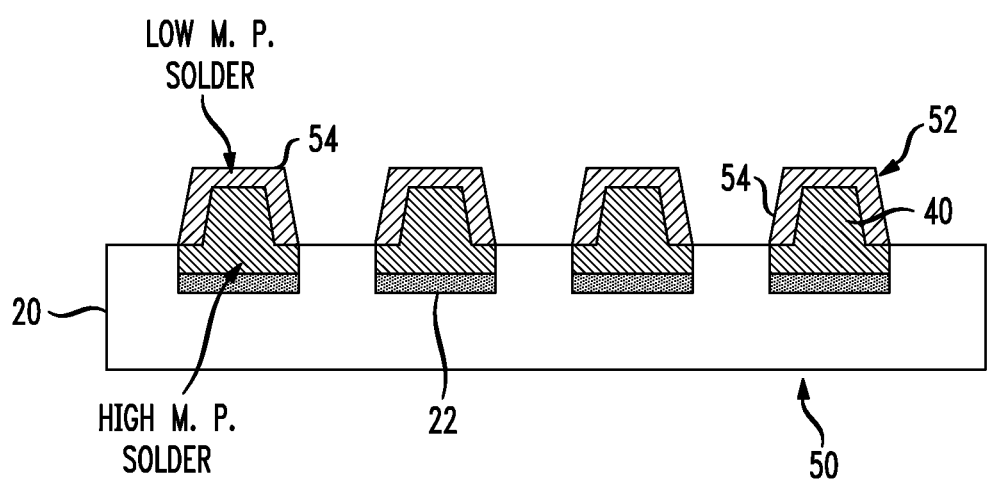

Once the injected solder 32' has solidified, the mask 24' is removed using the same procedure employed to remove the first mask 24 discussed above. Such removal is shown schematically in FIG. 1I. By applying the mask 24' with the wider hole openings contacting the substrate 20, there is little or no stress on the mask holes as the mask is removed. The structure 50 shown in FIG. 1J is obtained following removal of the mask 24'. It comprises the substrate 20, the contact pads 22, and solder bumps 52 comprising the bumps 40 formed from the first solder 32 and the overlying layer 54 of the solder 32' having a relatively low melting point. The difference in melting points between the two solders is preferably at least 50° C. While the layer 54 of solder 32' preferably completely encapsulates the entire exposed portion of the solder bump 40 formed from the solder 32 having a relatively high melting point, the resulting structure 50 may still function satisfactorily with less than complete encapsulation. In one or more exemplary embodiments, the layer 54 has a thickness between 1-100 microns. The solder bumps 52 formed in this IMS procedure have flat tops and accordingly do not require coining To accomplish complete covering (encapsulation) of the exposed portion of the solder bump 40 above the substrate 20, the mask 24' has openings 30' that are both larger in diameter and greater in height than the corresponding portions of the solder bumps that are coplanar with or extend above the top surface of the substrate. The diameters of the relatively wide openings of the holes 30' are the same as the diameters of the base portions of the solder bumps 40 within the substrate recesses 26. As discussed above, the top surfaces of the base portions of the solder bumps 40 are preferably coplanar with the top surface of the substrate in the structure 50 shown in FIG. 1J.

The methods described above can be used in the fabrication and packaging of integrated circuit chips, particularly flip chips; in particular, techniques set forth herein can be used to make arrays of solder bumps for attachment to an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end or consumer electronic applications to advanced computer products, having a display, a keyboard or other input device, and a central processor. The techniques set for the herein can be used for interconnecting the chip on chips or chip stacks for 3D applications, chips on wafers, chips on package or package on package.

Figure 2A:
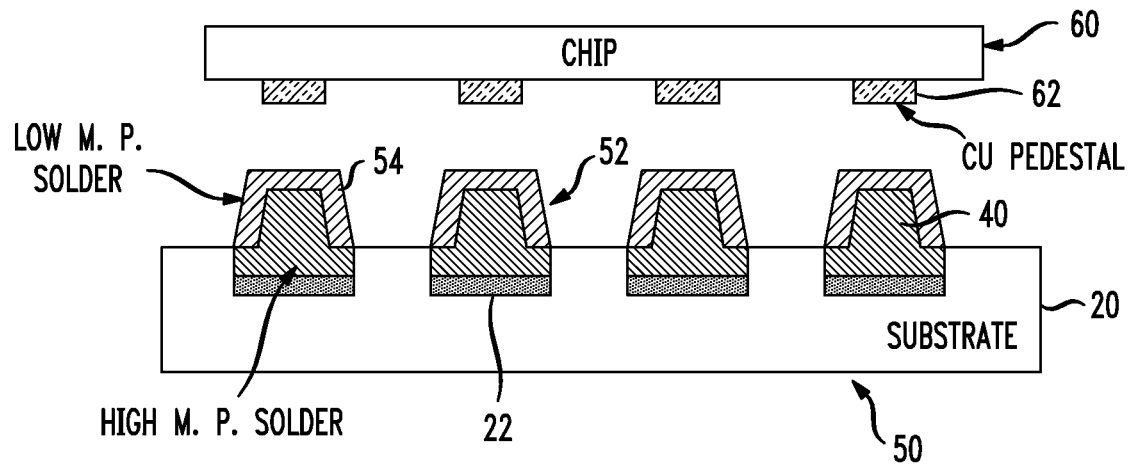
FIGS. 2A-C schematically illustrate steps of a procedure for flip chip bonding of a chip having no solder bumps with a substrate at relatively low temperature when Cu pillars are located on chip pads and relatively high temperature solders are located on substrate pads.
Figure 2B:
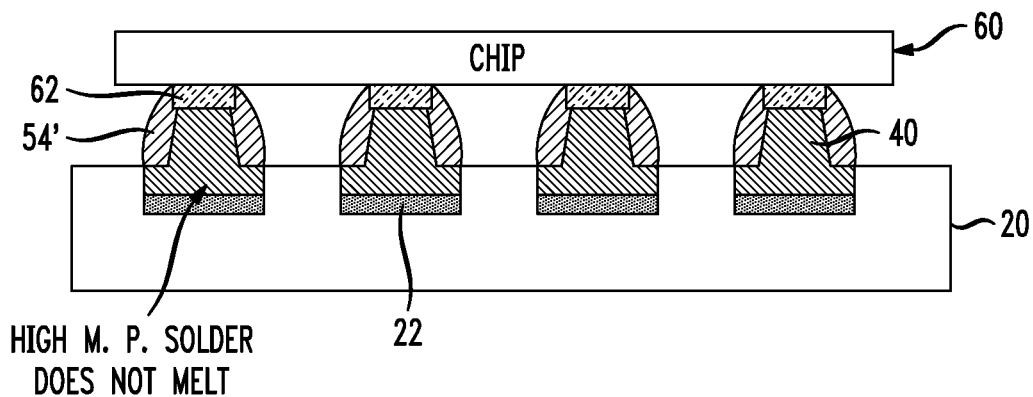
Figure 2C:
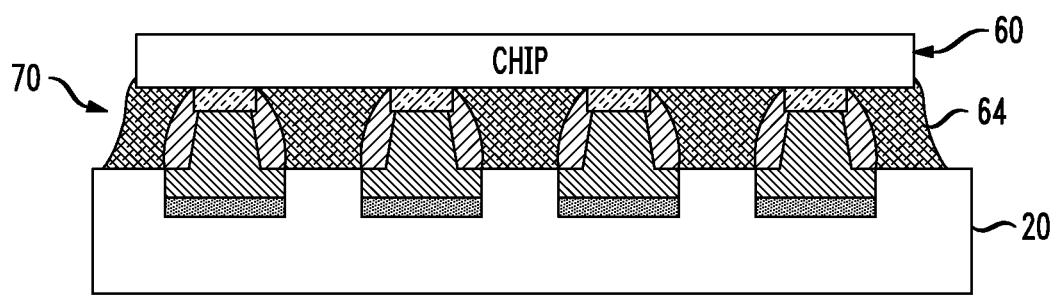

Flip chip bonding can be performed at relatively low bonding temperatures using structures 50 produced in accordance with the method described above. Referring to FIGS. 2A-C, an integrated circuit chip 60 including copper pedestals 62 is positioned such that the copper pedestals are aligned with the solder bumps 52. Once positioned as shown in FIG. 2B, the assembly is subjected to a temperature range sufficient to cause reflow of the solder layer 54 but low enough such that the underlying solder bumps 40 comprising the solder 32 having the higher melting point do not melt. Reflow is preferably conducted in a low oxygen environment. Flux can be used if it is required. The copper pedestals 62 may engage the solder bumps 40 upon reflow of the solder layer 54 comprising the second solder 32' as shown in the drawings. The solder 32' re-solidifies to form connections between the copper pedestals 62 and the solder bumps 40 attached to the substrate, thereby electrically and mechanically connecting the chip 60 to the substrate 20. The reflowed solder layer 54' may assume a rounded configuration due to surface tension and encapsulate both the solder bumps 40 and copper pedestals 62. Once the solder layer 54' has solidified and cooled, the space between the chip and substrate is filled with an underfill material 64 to protect the electrical connections of the resulting structure 70, as known to those of skill in the art. A high stand-off height (e.g. larger than 0.5 times the contact pad diameter) between the chip and substrate is provided in this exemplary embodiment.

Figure 3A:
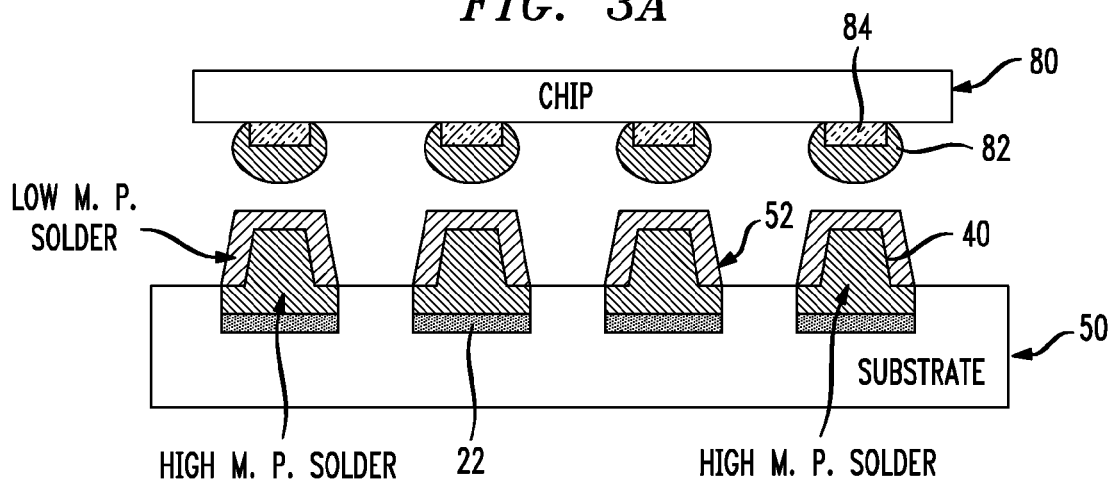
FIGS. 3A-C schematically illustrate steps of a procedure for flip chip bonding of a chip having solder bumps with a substrate at relatively low temperature wherein solders having relatively high melting point(s) are located on chip pads and substrate pads.
Figure 3B:
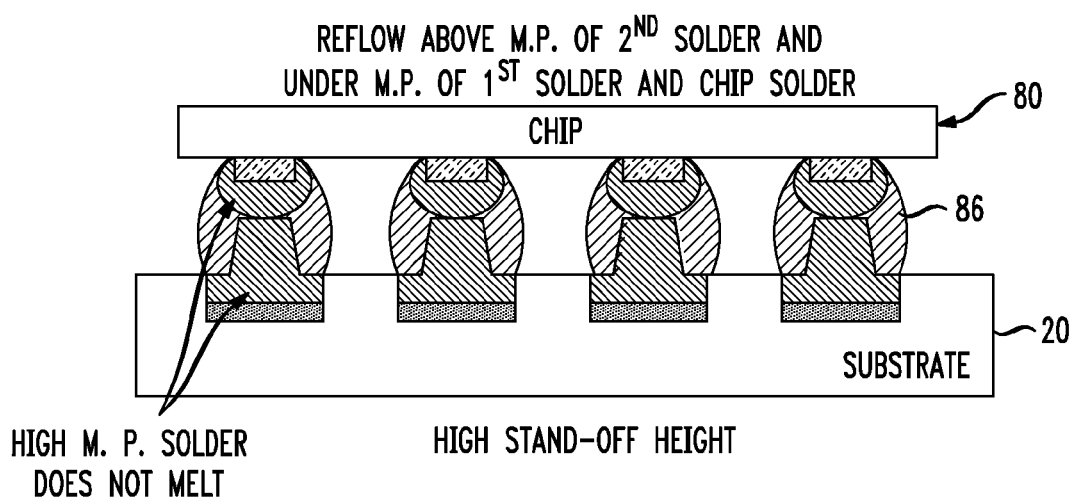
Figure 3C:
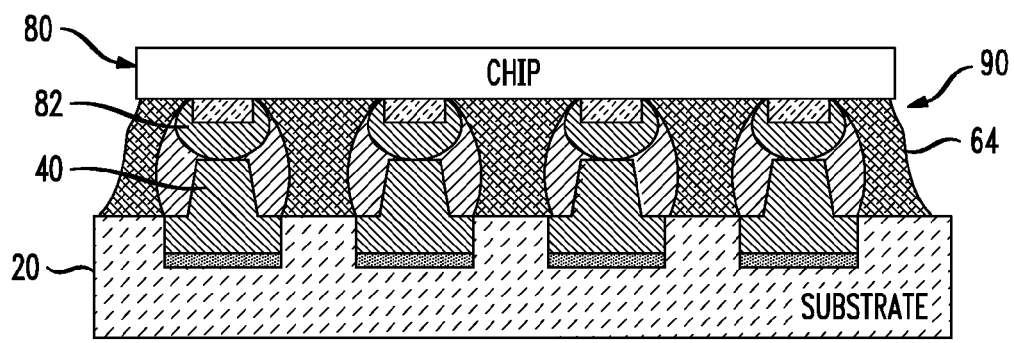

FIGS. 3A-C provide a flow diagram of the flip chip bonding of the structure 50 to an integrated circuit chip 80 having solder bumps 82 thereon. The solder bumps 82 on the chip in this exemplary embodiment have a melting point higher than that of the solder 32' forming the exposed layer 54 of the solder bumps 52 on the structure 50. This melting point may or may not be the same as the melting point of the solder 32 comprising the solder bumps 40 originally formed on the substrate 20. The solder bumps 82 are formed on electrically conductive wet-able contact pads 84 using techniques known to those of skill in the art. The chip and structure 50 are positioned such that the solder bumps 82, 52 are aligned with each other. They are then moved such that the solder bumps 82, 52 are in contact or near contact with each other. The chip and structure 50 are subjected to a temperature range sufficient to cause reflow of the solder 32' comprising the exposed layer 54 of the bumps, preferably in a low oxygen environment. The temperature range is not sufficient to cause melting of the solder bumps 82 on the chip 80 or those 40 underlying the exposed layers 54 of the solder bumps 52. The connecting structures 86 shown in FIG. 3B are accordingly formed. Once the solder 32' solidifies, underfill material 64 is provided between the chip 80 and structure 50 to protect the electrical connections of the resulting structure 90.

Figure 4A:
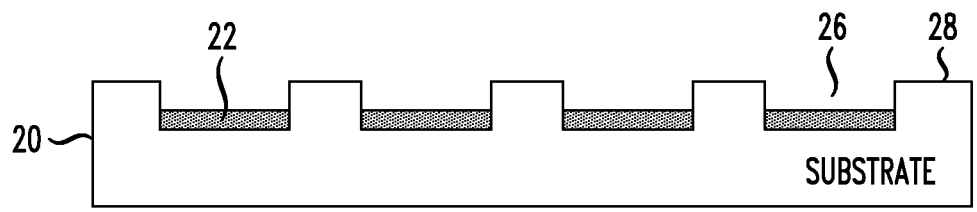
FIGS. 4A-E illustrate an IMS procedure for depositing two solders on a substrate by using one mask, the two solders having different melting points.
Figure 4B:
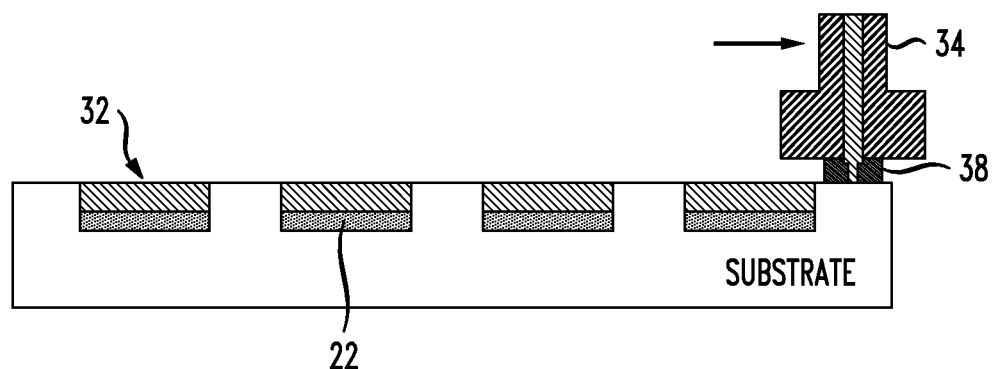

FIGS. 4A-E provide a flow diagram showing an alternative technique for forming solder bumps comprised of two different solder materials, each having a different melting point, on an organic substrate 20, through the use of only one mask. The substrate 20 and associated contact pads 22 and recesses 26 in this exemplary embodiment are the same as those shown in FIG. 1A and accordingly do not require further description. As shown in FIG. 4B, a fill head 34 injects molten solder 32 having a relatively high melting point into the recesses 26 of the substrate 20 where it contacts the wet-able contact pads 22. No mask is required during this procedure, as shown in FIG. 4B, because the contact pads are in recesses and lower than the solder resist substrate surface. The solder 32 fills the cavities 26, leaving no solder residue on the substrate surface 28, while the substrate is maintained in a low oxygen environment. The solder is subjected to sufficiently low temperatures and thereby caused to solidify, forming a solder element having a top surface that is coplanar with the top surface 28 of the substrate in this exemplary embodiment.

Figure 4C:
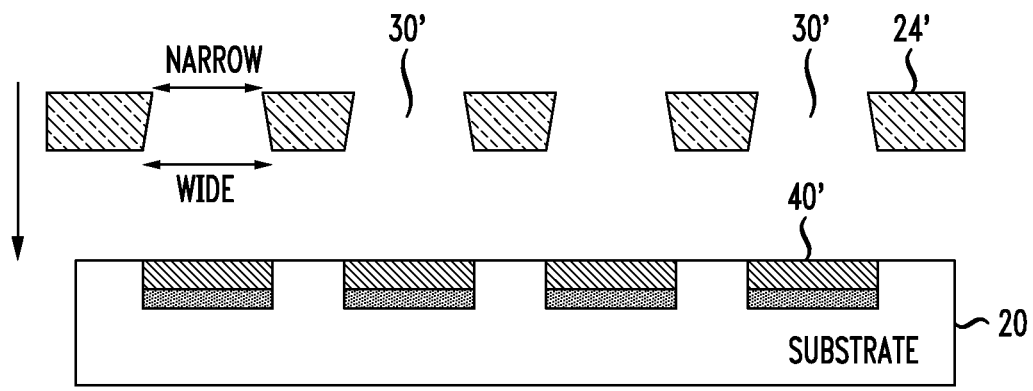

Referring to FIG. 4C, a mask 24' having frustoconical holes is provided. The mask 24' and substrate are positioned such that the wide portions of the holes 30' are aligned with the recesses 26 in the substrate 20. The diameter of the relatively wide portion of each hole 30' in the mask 24' is the same as the diameter of each corresponding recess 26 and solder element 40' in this exemplary embodiment. The mask 24' is applied to the substrate, contacting the planar top surface 28 thereof. The fill head 34 traverses the mask as the compliant material 38 exerts pressure thereon. Molten solder 32' having a melting point that is lower than the melting point of the solder 32 injected within the substrate recesses 26 is injected into the holes 30', filling them completely. This operation is also preferably conducted in a low oxygen environment. The previously injected solder 32, having solidified to form pillars 40', does not melt during this IMS procedure.

Figure 4D:
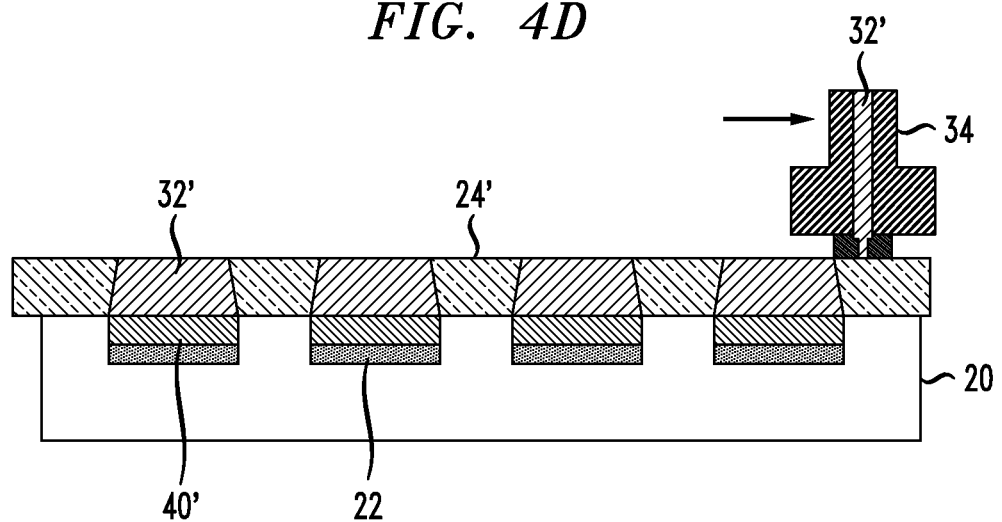
Figure 4E:
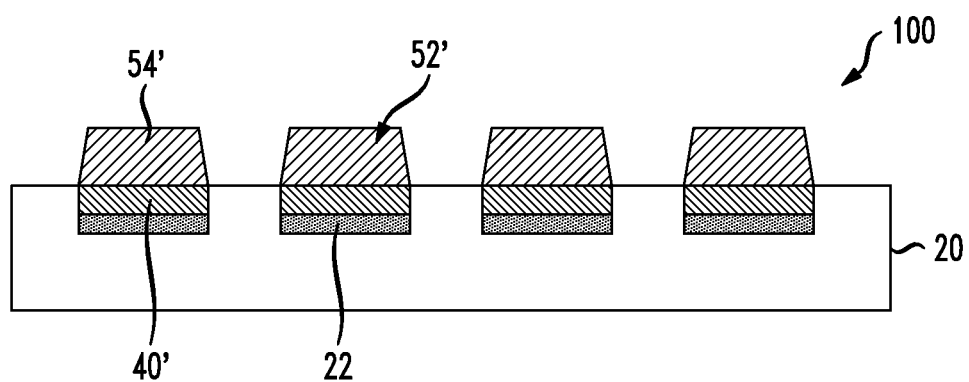

The structure 100 shown in FIG. 4E is formed upon solidification of the solder 32' and removal of the mask 24'. The structure comprises the substrate 20, the contact pads 22, and solder bumps 52' comprising the solder elements in the form of pillars 40' formed upon solidification of the solder 32 having a relatively high melting point and a covering layer 54' formed from the solder 32' injected into the mask openings. The solder bumps 52' have flat tops and fully cover the pillars 40'. While the stand-off height between the structure 100 and an integrated circuit chip coupled thereto is less than that obtained in the exemplary embodiments of FIGS. 2C and 3C following flip chip assembly, there are substantial benefits to such a structure 100 including relatively low temperature coupling to an integrated circuit chip and possibly a decrease in inter-metallic compound (IMC) formation. The relatively high melting point solder may further provide superior electromigration and thermal ratability.

While described above with respect to an organic substrate 20, the principles of the above embodiments are also applicable to inorganic substrates comprised of ceramic or other materials. In such cases, ball-limiting metallurgy (BLM) may be employed in place of the wet-able contact pads 22 discussed above. It will further be appreciated that while all of the solder bumps formed on a substrate may be comprised of solder bumps having relatively high melting points covered partially or entirely with a solder layer of a relatively low melting point, a given substrate may include additional solder bumps having different structures and characteristics if necessary or desired.

Aspects of the present invention are described herein with reference to flow diagram illustrations of methods and apparatus (systems) according to embodiments of the invention. It will be understood that each segment of the flow diagram illustrations representing one or more steps, and combinations of segments in the flow diagram illustrations, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flow diagrams.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flow diagrams or segments thereof.

It should be noted that any of the methods described herein can include an additional step of providing a system comprising distinct software modules embodied on a computer readable storage medium; the modules can include, for example, an initialization module, a module to cycle through test points and parameters, an output module to generate an output file, a post-processing module to reduce the data and search for anomalies, and the like. The method steps, such as those described with respect to FIGS. 1A-J, 2A-C, 3A-C and 4A-E can then be carried out using the distinct software modules and/or sub-modules of the system, as described above, executing on one or more hardware processors. Further, a computer program product can include a computer-readable storage medium with code adapted to be implemented to carry out one or more method steps described herein, including the provision of the system with the distinct software modules.

Given the discussion thus far, an exemplary method includes providing a substrate 20 having a plurality of contact pads 22, positioning a first flexible mask 24 on the substrate, the first flexible mask including a plurality of first holes 30, the first mask being positioned such that the plurality of first holes are aligned with the plurality of contact pads, injecting a molten first solder having a first melting point into the first holes, and allowing the first solder to solidify, whereby the first solder adheres to the contact pads and forms a plurality of first solder bumps 40, as shown by way of example in FIG. 1D. The first mask is removed from the substrate and a second mask 24' is positioned on the substrate, the second mask including a plurality of second holes 30' such as shown in FIGS. 1F and 1G. The second mask is positioned such that the second holes are aligned with the plurality of first solder bumps 40. A molten second solder 32' having a second melting point lower than the first melting point is injected into the second holes and covers the first solder bumps, the first solder bumps remaining solid during the injection of the molten second solder. The second solder solidifies to form second solder bumps 52 comprising the first and second solders, the second solder adhering to and forming layers 54 respectively covering each of the first solder bumps. In one or more embodiments of the method, the layers 54 formed by the second solder completely cover the first solder bumps above the substrate, such as shown in FIG. 1J. In further embodiments of the method, the first and second holes each have relatively large diameter openings at one end and relatively small diameter openings at an opposite end, wherein the method further includes positioning the first mask such that the relatively large diameter openings of the first holes face the substrate, positioning the second mask such that the relatively large diameter openings of the second holes face the substrate, and forming flat top surfaces on the first and second solder bumps without coining Positioning of the first and second masks 24, 24' in such a manner is shown in FIGS. 1B and 1G, while FIGS. 1C and 1H shown the formation of flat solder bump surfaces. In one or more embodiments of the method, the second holes 30' in the second mask 24' are larger in diameter and height than the corresponding diameter and height of the first holes 30 in the first mask 24. The step of removing the second mask is a step performed in a further embodiment of the method, such step being shown in FIG. 1I. The first and second holes have frustoconical configurations in some embodiments of the method. This allows the formation of first solder bumps having base portions and projecting portions as shown in FIG. 1C, the projecting portions extending above the top surface of the substrate while the top surfaces of the base portions are coplanar with the top surface of the substrate 20. The step of injecting a molten first solder is performed by a fill head in one or more embodiments of the method, the fill head including compliant material. Pressure on the first mask is applied with the compliant material as molten solder is injected. The substrate is an organic substrate in some exemplary embodiments. The method can further include bonding an integrated circuit chip to the substrate by contacting electrically conductive elements on the integrated circuit chip with the second solder bumps and causing reflow of the layers of second solder, the first solder bumps remaining solid during reflow of the layers of second solder. The conductive elements of the integrated circuit chip are caused to engage the first solder bumps following reflow of the layers of second solder in some embodiments, as shown in FIG. 2B. At least one of the first and second masks is applied as a dry film in one or more embodiments of the method. The substrate includes a plurality of recesses 26, the contact pads 22 being within the recesses, in one or more exemplary embodiments.

A further exemplary method includes obtaining a structure comprising a substrate having a plurality of recesses, a plurality of electrically conductive contact pads within the recesses, and a plurality of first solder bumps 40 comprised of a first solder adjoining the contact pads and having portions extending above a top surface of the substrate 20. A flexible mask 24' is positioned on the substrate in a manner as shown schematically in FIG. 1G, the mask including a plurality of holes 30'. The mask is positioned such that the holes are aligned with the plurality of first solder bumps. The method further includes injecting a molten second solder 32' having a melting point lower than the melting point of the first solder into the holes and covering the first solder bumps, the first solder bumps remaining solid during the injection of the molten second solder, allowing the second solder to solidify to form second solder bumps 52 comprising the first and second solders, the second solder adhering to and forming layers 54 respectively covering each of the first solder bumps, and removing the flexible mask from the substrate. In one or more embodiments, the second solder 32' completely covers the first solder bumps above the substrate such as shown in FIG. 1H and forms flat top surfaces above the first solder bumps. The flexible mask has openings 30' that are larger in diameter and height than the corresponding diameter and height of the portions of the first solder bumps extending above the substrate, as illustrated in FIG. 1G, in other exemplary embodiments. The mask holes have frustoconical configurations in one or more embodiments. The step of injecting a second solder is performed by a fill head including compliant material in one or more embodiments of the method, wherein pressure is applied on the flexible mask by the compliant material 38. The method may further include bonding an integrated circuit chip, such as chip 60 or chip 80, to the substrate by reflow of the layers of second solder. Following reflow, the conductive elements on the chip are caused to engage the first solder bumps 40, such as shown in FIGS. 2B and 3B. The flexible mask may be applied as a dry film in any embodiment of the method.

A third exemplary method includes providing a substrate 20 having a plurality of recesses 26 and a plurality of electrically conductive contact pads within the recesses, injecting a molten first solder 32 having a first melting point into the recesses, allowing the first solder to solidify, whereby the first solder adheres to the contact pads and forms a plurality of solder elements such as bumps 40 or elements 40', and positioning a flexible mask 24 or 24' on the substrate. The flexible mask includes a plurality of holes, the mask being positioned such that the plurality of holes are aligned with the plurality of recesses in the substrate. The method further includes injecting a molten second solder 32' having a second melting point lower than the first melting point into the holes, covering the solder elements formed from the first solder while the solder elements remain in solid form, and allowing the second solder to solidify, whereby the first solder adheres to the contact pads and forms a plurality of solder bumps. In one or more further embodiments of the method, the solder elements are formed with top surfaces coplanar with a top surface of the substrate in one or more exemplary embodiments of the method, such as shown in FIGS. 4C and 1D, the latter figure showing solder bumps 40 wherein only part of the top surface is coplanar with the substrate 20. The solder elements in each recess are completely covered by the second (low melting point) solder in some embodiments and form flat top solder bump surfaces with the second solder, such as shown in FIG. 4D. The step of injecting the molten second solder may be performed by a fill head 34, the fill head including compliant material 38, further including the step of applying pressure on the flexible mask with the compliant material as the molten second solder is injected, as schematically illustrated in FIG. 4D. The method can further include bonding an integrated circuit chip to the substrate by contacting electrically conductive elements on the integrated circuit chip with the solder bumps and causing reflow of the second solder, the solder elements remaining solid during reflow of the second solder. FIG. 2B is illustrative of the bonding of a chip 60 having electrically conductive elements 62 to a substrate having solder bumps formed in accordance with the exemplary method of FIGS. 1A-J. The solder elements may be formed having top surfaces that are entirely coplanar with the top surface of the substrate as shown in FIG. 1D. No mask is required in the step shown in FIG. 1D.

A further exemplary method includes obtaining a structure comprising a substrate including a plurality of recesses 26, a plurality of electrically conductive contact pads 22 within the substrate, and a plurality of solder bumps, each solder bump including a first solder bump structure comprised of a first solder 32 having a first melting point, the first solder bump structure adjoining one of the contact pads and extending above a top surface of the substrate, and a layer of second solder completely covering the first solder bump structure, the second solder 32' having a lower melting point than the first solder. The method further includes contacting electrically conductive elements of an integrated circuit chip (e.g. chip 60 or 80) with the solder bumps, causing reflow of the layers of second solder, the first solder bump structures remaining solid during reflow of the layers of second solder, and causing the second solder to solidify such that the structure is attached to the integrated circuit chip. The solder bumps in one or more embodiments have flat top surfaces such that the electrically conductive elements of the integrated circuit chip contact the flat top surfaces of the solder bumps.

An exemplary structure in accordance with one embodiment includes a substrate having a plurality of recesses and a plurality of electrically conductive contact pads, each contact pad being positioned in one of the plurality of recesses in the substrate. A plurality of first solder bumps extending into the plurality of recesses, each solder bump contacting one of the plurality of contact pads and extending above a top surface of the substrate. The first solder bumps are comprised of a first solder having a relatively high melting point. Each of the plurality of first solder bumps is completely covered above the substrate by a layer comprising a second solder, the second solder having a melting point, below the melting point of the first solder. The substrate is comprised of organic material in one or more embodiments of the exemplary structure. The layers covering each of the first solder bumps define flat top surfaces in further embodiments. The first solder bumps have flat top surfaces in embodiments of the exemplary structure. In one or more further exemplary embodiments, each of the first solder bumps 40 includes a base portion within one of the plurality of recesses 26 and a top portion extending upwardly from the base portion and outside the one of the plurality of recesses, each of the layers 54 of second solder contacting both the base and top portions of one of the first solder bumps.

FIG. 1J shows such an exemplary structure. Each of the top portions of the first solder bumps has a frustoconical configuration in accordance with a further embodiment of the structure, as shown in FIG. 1J. Each layer 54 may includes an outer surface having a frustoconical configuration, also as shown in FIG. 1J. Each of the base portions of the solder bumps 40 has a diameter equal to the diameter of the contact pads respectively contacting the base portions in some embodiments, and each of the top portions has a maximum diameter smaller than the diameter of the contact pads that respectively contact the base portions. The melting point of the second solder is at least 50° C. lower than the melting point of the first solder in one or more embodiments. Each of the base portions of the first solder bumps has a top surface coplanar with a top surface of the substrate in embodiments of the structure.

A further structure provided in accordance with the principles of the disclosure. Such a further structure includes a substrate 20 including a plurality of recesses and a plurality of electrically conductive contact pads 22, each contact pad being positioned in one of the plurality of recesses in the substrate. The structure includes a plurality of solder bumps, each solder bump comprising a solder element 40' comprised of a first solder having a first melting point, each solder element being positioned within one of the plurality of recesses, contacting one of the plurality of contact pads and having a top surface coplanar with a top surface of the substrate, each solder bump further comprising a covering layer 54' comprised of a second solder having a second melting point lower than the first melting point, each covering layer contacting one of the solder elements and extending above the top surface of the substrate. In a specific exemplary embodiment of the structure, each covering layer 54' forms a frustoconical element having a flat top surface, such as shown in FIG. 4D. Each of the covering layers completely covers one of the solder elements above the substrate in one or more embodiments of the structure. The second melting point is at least 50° C. lower than the first melting point in one or more embodiments of the structure. The substrate comprises an organic material in further embodiments of the structure. The structure further includes a flexible mask 24' having a plurality of frustoconical holes extending therethrough, each hole adjoining one of the solder bumps, such as shown in FIG. 4D. The flexible mask may comprise a dry film mask. The top surface of the solder element is entirely coplanar with the top surface of the substrate in one or more embodiments, such as the embodiment of FIG. 4E.

A third exemplary structure comprises a substrate having a top surface and a plurality of electrically conductive contact pads, a plurality of solder bumps 40, each of the solder bumps including a frustoconical element contacting one of the contact pads 22, the frustoconical element being comprised of a first solder material, and solder layers completely 54 covering each of the frustoconical elements, each solder layer being comprised of a second solder material having a melting point lower than the melting point of the first solder material. A further exemplary embodiment of the structure includes a flexible mask 24' having a plurality of frustoconical holes extending therethrough, each hole adjoining one of the solder bumps such as shown in FIG. 1I.

It will be appreciated and should be understood that the exemplary embodiments of the invention described above can be implemented in a number of different fashions. The embodiments were chosen and described in order to best explain the principles of the invention and the practical application, and to enable others of ordinary skill in the art to understand the invention for various embodiments with various modifications as are suited to the particular use contemplated. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising:
   obtaining a structure comprising:
      a substrate including a plurality of recesses;
      a plurality of electrically conductive contact pads within the recesses; and
      a plurality of solder bumps, each solder bump including a first solder bump structure comprised of a first solder having a first melting point, the first solder bump structure adjoining one of the contact pads and extending above a top surface of the substrate, and a layer of second solder completely covering the first solder bump structure, the second solder having a lower melting point than the first solder;
   contacting electrically conductive elements of an integrated circuit chip with the solder bumps;
   causing reflow of the layers of second solder, the first solder bump structures remaining solid during reflow of the layers of second solder; and
   causing the second solder to solidify such that the structure is attached to the integrated circuit chip.

2. The method of claim 1, wherein the solder bumps have flat top surfaces, further including contacting the electrically conductive elements of the integrated circuit chip with the flat top surfaces of the solder bumps.

* * * * *